United States Patent
Ozeki

(10) Patent No.: US 12,439,689 B2
(45) Date of Patent: Oct. 7, 2025

(54) DISPLAY DEVICE

(71) Applicant: Magnolia White Corporation, Tokyo (JP)

(72) Inventor: Yoshitaka Ozeki, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 669 days.

(21) Appl. No.: 17/716,095

(22) Filed: Apr. 8, 2022

(65) Prior Publication Data

US 2022/0328532 A1  Oct. 13, 2022

(30) Foreign Application Priority Data

Apr. 9, 2021 (JP) .............................. 2021-066720
Mar. 7, 2022 (JP) .............................. 2022-034757

(51) Int. Cl.
- *H01L 27/12* (2006.01)
- *H10D 86/40* (2025.01)
- *H10D 86/60* (2025.01)

(52) U.S. Cl.
CPC ........... *H10D 86/60* (2025.01); *H10D 86/423* (2025.01); *H10D 86/443* (2025.01)

(58) Field of Classification Search
CPC . H01L 27/1225; H01L 27/12; H01L 27/1244; H01L 27/1251; H01L 29/78633; H01L 29/786; H01L 29/7869; G02F 1/1362; G02F 1/134336; G02F 1/134363; G02F 1/136209; G02F 1/153; G02F 1/1675; H10D 86/60; H10D 86/40; H10D 86/443; H10D 86/471; H10D 30/6723; H10D 30/67; H10D 30/6755; H10D 86/423
See application file for complete search history.

(56) References Cited

U.S. PATENT DOCUMENTS

| | | | |
|---|---|---|---|
| 11,088,173 B2* | 8/2021 | Lee | ..................... H01L 27/1222 |
| 11,215,891 B2* | 1/2022 | Kitagawa | .......... G02F 1/136286 |
| 2012/0200546 A1 | 8/2012 | Miyamoto et al. | |
| 2020/0013807 A1* | 1/2020 | Lee | ................... H01L 21/02164 |
| 2020/0089038 A1 | 3/2020 | Yoshino et al. | |
| 2020/0303425 A1 | 9/2020 | Hara et al. | |
| 2020/0371401 A1 | 11/2020 | Kitagawa et al. | |

FOREIGN PATENT DOCUMENTS

JP  2020-076950 A  5/2020

OTHER PUBLICATIONS

English translation of Office Action issued in related Chinese Patent Application No. 202210325804.3 dated Mar. 26, 2024. 12 pages.

* cited by examiner

*Primary Examiner* — Nikolay K Yushin
(74) *Attorney, Agent, or Firm* — K&L Gates LLP

(57) ABSTRACT

A display device includes a substrate, a first transistor including an oxide semiconductor layer, a first gate insulating layer, and a first gate electrode, the first transistor being provided in a display region, and a light-shielding layer provided between the substrate and the oxide semiconductor layer. The light-shielding layer includes a first light-shielding metal layer and a second light-shielding metal layer. The first light-shielding metal is provided between the substrate and the oxide semiconductor layer. The second light-shielding metal layer covers the top surface and side surface of the first light-shielding metal layer and faces the oxide semiconductor layer.

19 Claims, 8 Drawing Sheets

DISPLAY DEVICE

This application is based upon and claims the benefit of priority from the prior Japanese Patent Application 2021-066720, filed on Apr. 9, 2021, and the prior Japanese Patent Application 2022-034757, filed on Mar. 7, 2022, the entire contents of which are incorporated herein by reference.

FIELD

One embodiment of the present invention relates to a display device. In particular, one embodiment of the present invention relates to a display device in which a transistor having an oxide semiconductor is used.

BACKGROUND

Recently, the development of a transistor using an oxide semiconductor as a channel has been proceeding in place of amorphous silicon, low-temperature polysilicon, and single-crystal silicon (e.g., Japanese Laid Open Patent No. 2020-076950). A transistor using an oxide semiconductor as a channel is formed in a simple structure in a low-temperature process similar to a transistor using amorphous silicon as a channel. It is known that a transistor using an oxide semiconductor as a channel has higher mobility than a transistor using amorphous silicon as a channel, and that the transistor has very low off current characteristics.

Recently, the pixel size of a display device has been fined. As the pixel size is fined, the reduction of wiring width and transistor size is being examined. However, there is a limit to these reductions, and the opening ratio of a pixel is suffered due to the arrangement of a metal layer and a semiconductor layer constituting a pixel circuit. Therefore, using a transistor with oxide semiconductor layers as a channel for pixel circuit transistors, which can provide sufficient characteristics to drive pixel circuits even if the transistor size is small, has been developed.

SUMMARY

A transistor using an oxide semiconductor as a channel may have characteristic fluctuation (e.g., threshold fluctuation) due to exposure to light. If characteristic fluctuation occurs, a normal display may not be possible. For this reason, a configuration in which a light-shielding layer is provided under a transistor using an oxide semiconductor as a channel is provided (Japanese Laid Open Patent No. 2020-076950).

On the other hand, a transistor using low-temperature polysilicon (LTPS) as a channel may be provided in peripheral circuits. In this case, the light-shielding layer of the transistor using the oxide semiconductor as the channel and a gate electrode of the transistor using the LTPS as the channel may be in a same layer. In this case, the thickness of the gate electrode of the LTPS transistor requires a certain thickness or less. Therefore, the light-shielding layer which has the same thickness as the gate electrode's may not be sufficient to prevent from the exposure, and the characteristic of the oxide semiconductor may fluctuate.

In view of such problems, one of the objects of the present invention is to provide a display device capable of performing high-definition displays while suppressing the characteristic fluctuation of the oxide semiconductor transistor.

A display device according to an embodiment of the present invention includes a substrate, a first transistor including an oxide semiconductor layer, a first gate insulating layer, and a first gate electrode, the first transistor being provided in a display region, and a light-shielding layer provided between the substrate and the oxide semiconductor layer, wherein the light-shielding layer includes a first light-shielding metal layer and a second light-shielding metal layer, the first light-shielding metal layer is provided between the substrate and the oxide semiconductor, and the second light-shielding metal layer covers the top surface and side surface of the first light-shielding metal layer and faces the oxide semiconductor layer.

A display device according to an embodiment of the present invention includes a substrate, a first transistor including an oxide semiconductor layer, a first gate insulating layer, and a first gate electrode, the first transistor being provided in a display region, a light-shielding layer provided between the substrate and the oxide semiconductor layer and overlapping the oxide semiconductor layer, a second transistor including a second semiconductor layer, a second gate insulating layer, and a second gate electrode, the second transistor being provided in a peripheral region located around the display region, and the second semiconductor layer containing silicon, wherein a thickness of the light-shielding layer is greater than a thickness of the second gate electrode.

DESCRIPTION OF EMBODIMENTS

Figure 1:
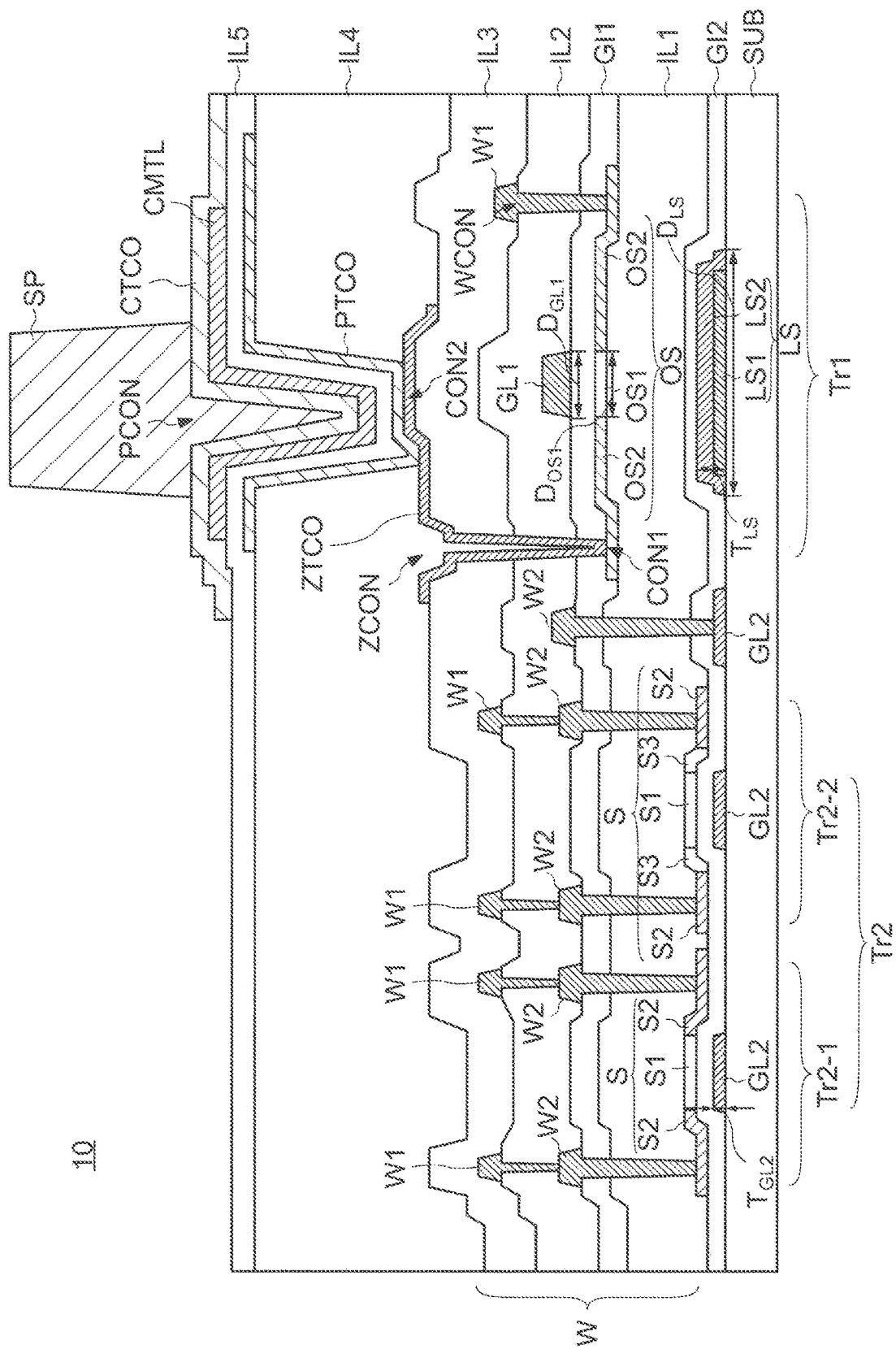
FIG. 1 is a cross-sectional view showing an outline of a display device according to an embodiment of the present invention.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the illustrated shapes are merely examples and are not intended to limit the interpretation of the present invention. In this specification and the drawings, the same elements as those described above with reference to the preceding drawings are denoted by the same symbols, and a detailed description thereof may be omitted as appropriate.

In the embodiments of the present invention, the direction from a substrate toward an oxide semiconductor layer is referred to as above or upward. On the contrary, the direction from an oxide semiconductor layer toward a substrate is referred to as below or downward. As described above, although the phrase "above" or "below" is used for convenience of explanation, for example, the upper and lower relations between a substrate and an oxide semiconductor layer may be arranged so as to be opposite to those shown in the drawing. In the following description, for example, the expression "an oxide semiconductor layer on a substrate" merely describes the vertical relationship between the substrate and the oxide semiconductor layer as described above, and other members may be arranged between the substrate and the oxide semiconductor layer. Upper or lower means the stacking order in a structure in which layers are stacked, and for example when it is expressed as a pixel electrode "above" a transistor, it may mean just a vertical positional relationship therebetween, but it does not require their overlapping relationship in a plan view. On the other hand, when it is expressed as a pixel electrode "vertically above" a transistor, it requires their overlapping relationship in a plan view.

"Display device" refers to a structure that displays images using an electro-optic layer. For example, the term display device may refer to a display panel including an electro-optic layer, or it may refer to a structure with other optical members (e.g., a polarized member, a backlight, a touch panel, etc.) attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiment described later will be described by exemplifying a liquid crystal display device including a liquid crystal layer as a display device, the structure in the present embodiment can be applied to a display device including the other electro-optical layers described above.

The expressions "a includes A, B, or C", "a includes any of A, B, and C", and "a includes one selected from a group consisting of A, B, and C" do not exclude the case where a includes a plurality of combinations of A to C unless otherwise specified.

Furthermore, these expressions do not exclude the case where a includes other elements.

The following embodiments may be combined with each other as long as there is no technical contradiction.

1. First Embodiment

[1-1. Configuration of Display Device 10]

Figure 2:
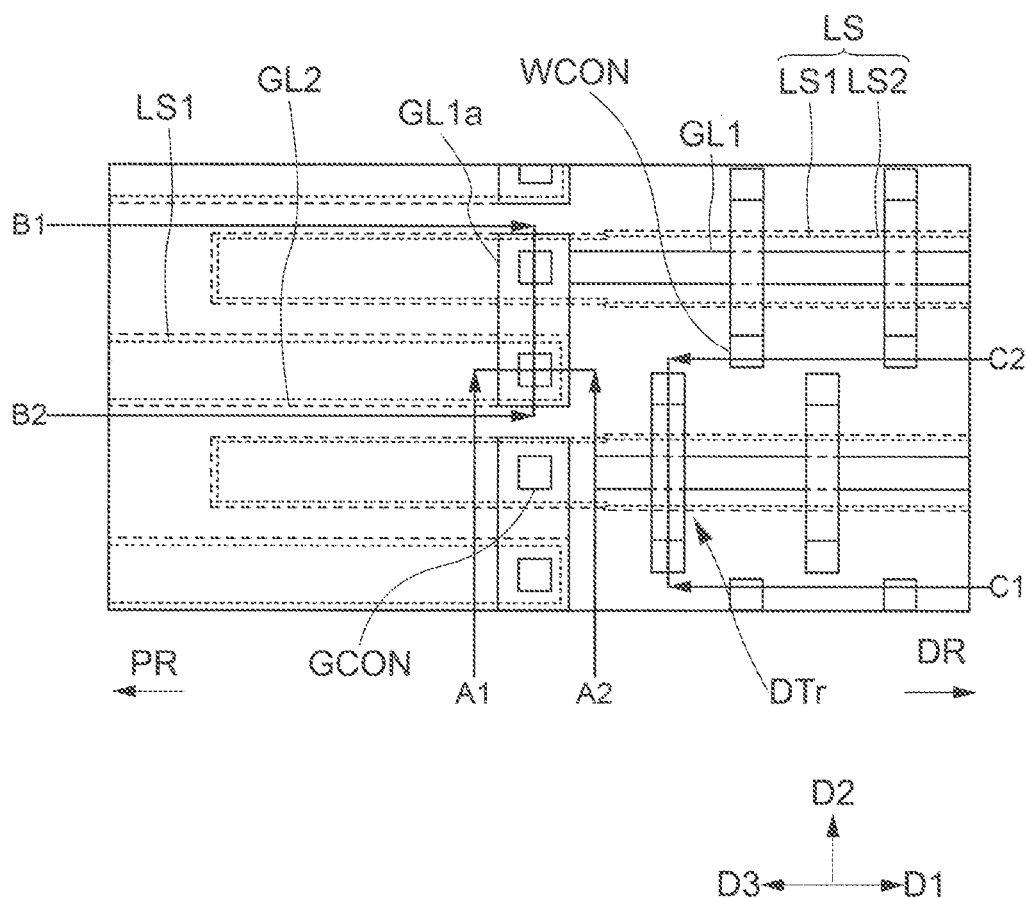
FIG. 2 is a plan view showing an outline of a display device according to an embodiment of the present invention.
Figure 3:
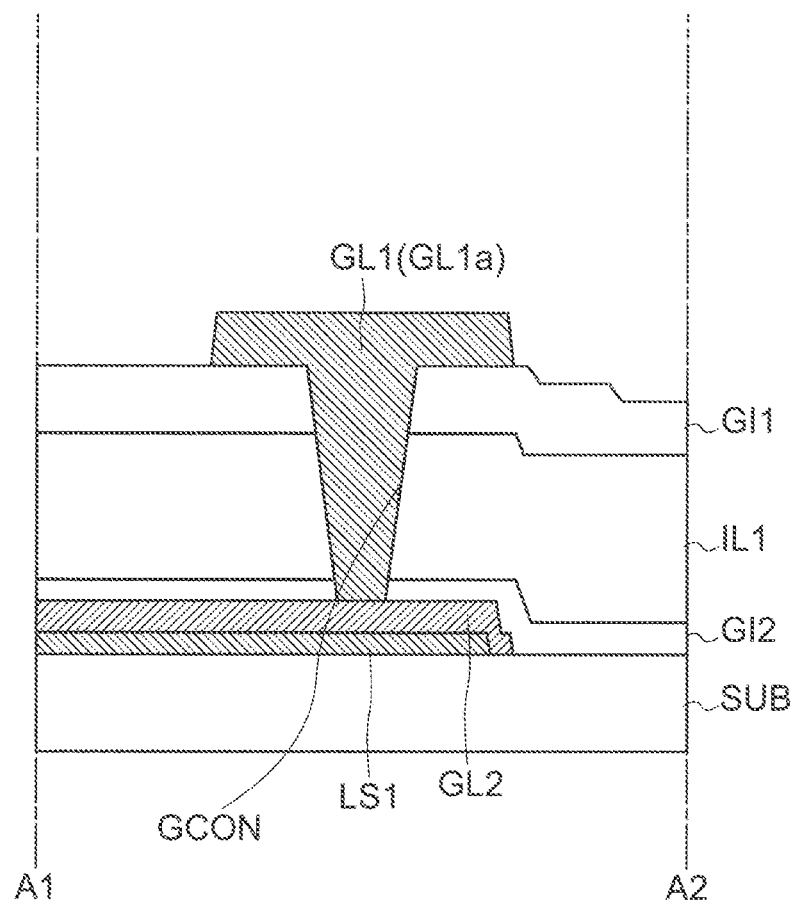
FIG. 3 is a cross-sectional view showing an outline of a display device according to an embodiment of the present invention.
Figure 4:
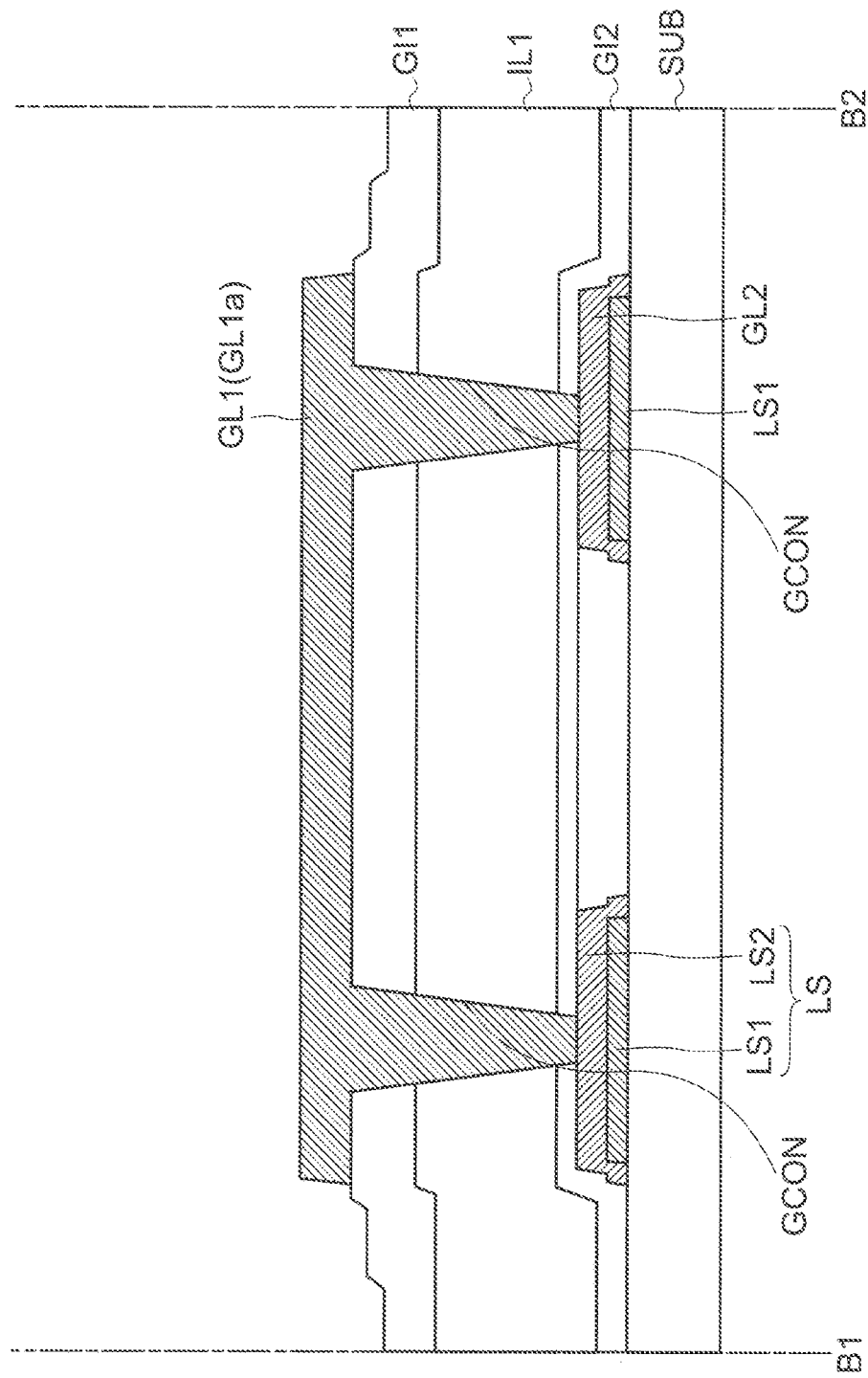
FIG. 4 is a cross-sectional view showing an outline of a display device according to an embodiment of the present invention.
Figure 5:
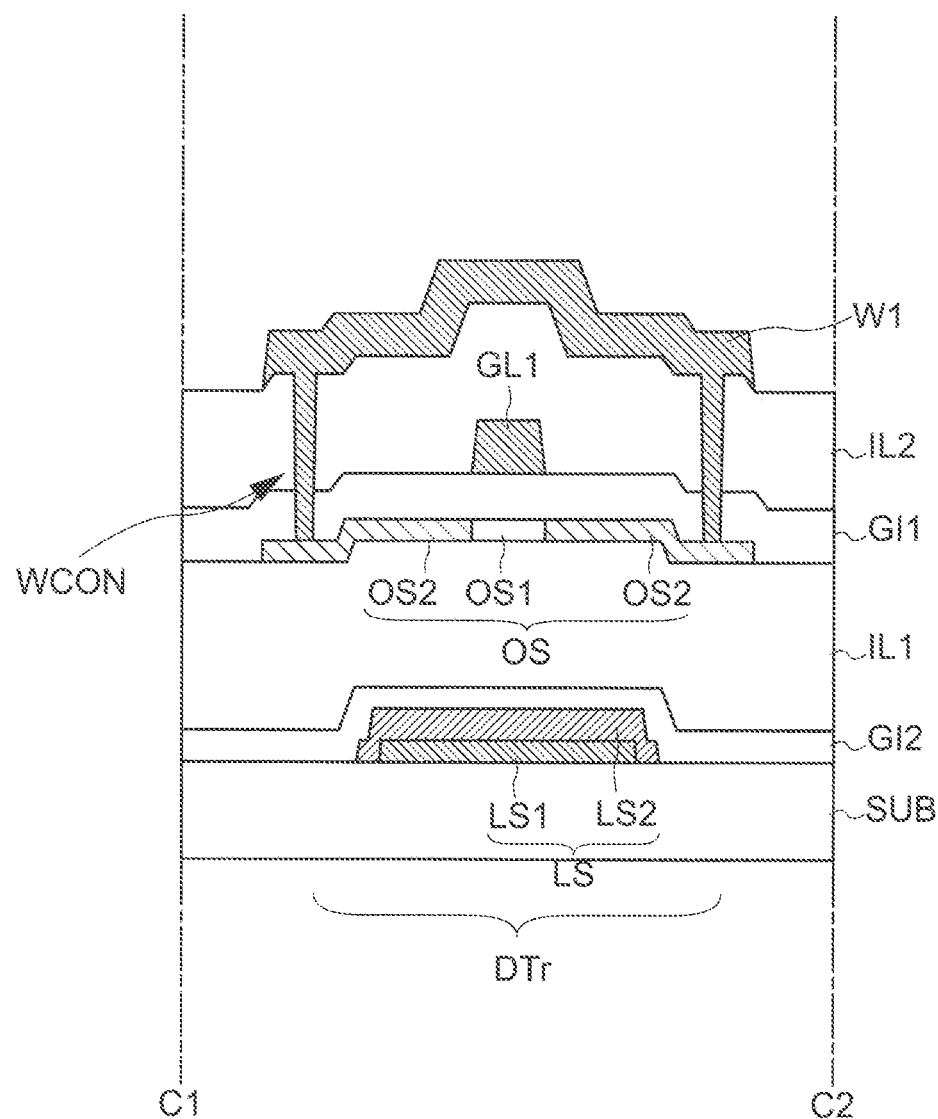
FIG. 5 is a cross-sectional view showing an outline of a display device according to an embodiment of the present invention.

A configuration of a display device 10 according to an embodiment of the present invention will be described with reference to FIG. 1 to FIG. 5. FIG. 1 is a cross-sectional view showing an outline of a display device according to an embodiment of the present invention. FIG. 2 is a plan view showing an outline of a display device according to an embodiment of the present invention. FIG. 3 to FIG. 5 are cross-sectional views of each part corresponding to a plan view shown in FIG. 2.

As shown in FIG. 1, the display device 10 includes a substrate SUB. The display device 10 includes a transistor T1, a transistor Tr2, a wiring W, a connecting electrode ZTCO, a pixel electrode PTCO, a common auxiliary electrode CMTL, and a common electrode CTCO on the substrate SUB. TCO is an abbreviation for Transparent Conductive Oxide. The transistor Tr is provided in a display region. Specifically, the transistor Tr is a transistor included in a pixel circuit of the display device 10. The transistor Tr2 is provided in a peripheral region located around the display region. Specifically, the transistor Tr2 is a transistor included in a peripheral circuit. Although details will be described later, the peripheral circuit is a circuit for driving the pixel circuit.

[1-2. Configuration of Transistor Tr1]

The transistor Tr1 (also referred to as the first transistor) includes an oxide semiconductor layer OS, a gate insulating layer GI1, and a gate electrode GL1. The gate electrode GL1 faces the oxide semiconductor layer OS. The gate insulating layer GI1 is provided between the oxide semiconductor layer OS and the gate electrode GL1. In the present embodiment, although a top-gate transistor in which the oxide semiconductor layer OS is provided closer to the substrate SUB than the gate electrode GL1 is exemplified, a bottom-gate transistor in which the positional relationship between the gate electrode GL1 and the oxide semiconductor layer OS is reversed may be used.

The oxide semiconductor layer OS includes oxide semiconductor layers OS1, OS2. The oxide semiconductor layer OS1 overlaps the gate electrode GL1 in a plan view. The oxide semiconductor layer OS1 functions as a semiconductor layer and is switched between a conductive state and a non-conductive state according to the voltage supplied to the gate electrode GL1. That is, the oxide semiconductor layer OS1 functions as a channel of the transistor Tr1. The oxide semiconductor layer OS2 functions as a conductive layer. The oxide semiconductor layers OS1, OS2 are layers formed from the same oxide semiconductor layer. For example, the oxide semiconductor layer OS2 is a region whose resistance is reduced by doping impurities into a layer having the same physical property as the oxide semiconductor layer OS1.

An insulating layer IL2 is provided on the gate electrode GL1. A wiring W1 is provided on the insulating layer IL2. The wiring W1 is connected to the oxide semiconductor layer OS2 via an opening WCON provided in the insulating layer IL2 and the gate insulating layer GI1. A data signal related to the gradation of the pixel is transmitted to the wiring W1. An insulating layer IL3 is provided on the insulating layer IL2 and the wiring W1. The connecting electrode ZTCO is provided on the insulating layer IL3. The connecting electrode ZTCO is connected to the oxide semiconductor layer OS2 via an opening ZCON provided in the insulating layers IL3, IL2, and the gate insulating layer GI1. The connecting electrode ZTCO is in contact with the oxide semiconductor layer OS2 at the bottom of the opening ZCON. The connecting electrode ZTCO is a transparent conductive layer.

A region where the connecting electrode ZTCO and the oxide semiconductor layers OS2 are in contact with each other is referred to as a first contact region CON1. The connecting electrode ZTCO may be referred to as the "first transparent conductive layer". Although described in detail later, the first transparent conductive layer is in contact with the oxide semiconductor layer OS2 in the first contact region CON1 that does not overlap the gate electrode GL1 and the wiring W1 in a plan view. In addition, the first contact region CON1 is included in the display region of the pixel in a plan view.

For example, when a transparent conductive layer such as an ITO layer is formed so as to be in contact with a semiconductor layer such as a silicon layer, the surface of the semiconductor layer is oxidized by a process gas or oxygen ions at the time of a deposition of an ITO film. Since the oxide layer formed on the surface of the semiconductor layer has high resistance, the contact resistance between the semiconductor layer and the transparent conductive layer becomes high, resulting in a poor electrical contact between the two. On the other hand, even if the transparent conductive layer described above is formed to be in contact with the oxide semiconductor layer, since the high-resistance oxide layer as described above is not formed on the surface of the oxide semiconductor layer, no defect occurs in the electrical contact between the oxide semiconductor layer and the transparent conductive layer.

An insulating layer IL4 is provided on the connecting electrode ZTCO. The insulating layer IL4 relieves a step formed by a structure provided below the insulating layer IL4. The insulating layer IL4 may be referred to as a planarization film. The pixel electrode PTCO is provided on the insulating layer IL4. The pixel electrode PTCO is connected to the connecting electrode ZTCO via an opening PCON provided the in insulating layer IL4. A region where the connecting electrode ZTCO and the pixel electrode PTCO are in contact with each other is referred to as a second contact region CON2. In a plan view, the second contact region CON2 overlaps the gate electrode GL1. The pixel electrode PTCO is a transparent conductive layer.

An insulating layer IL5 is provided on the pixel electrode PTCO. The common auxiliary electrode CMTL and the common electrode CTCO are provided on the insulating layer IL5. The common auxiliary electrode CMTL and the common electrode CTCO have different plane patterns from each other. The common auxiliary electrode CMTL is a metal layer. The common electrode CTCO is a transparent conductive layer. The electrical resistance of the common auxiliary electrode CMTL is lower than the electrical resistance of the common electrode CTCO. The common auxiliary electrode CMTL also functions as a light-shielding layer, for example, by shielding light from adjacent pixels, it is possible to suppress color mixture. A spacer SP is provided on the common electrode CTCO.

The spacers SP are provided in some of the pixels. For example, one of the spacer SP may be provided for any one pixel of the blue pixel, the red pixel, or the green pixel. However, the spacer SP may be provided in all of the pixels. The height of the spacer SP may be half the height of the cell gap. Another spacer is also provided on a counter substrate, and the spacer on the counter substrate and the spacer SP may overlap in a plan view.

A light-shielding layer LS is provided between the transistor Tr1 and the substrate SUB. In this example, the light-shielding layer LS is provided between the oxide semiconductor layers OS and the substrate SUB. In the present embodiment, light-shielding layers LS1 and LS2 are provided as the light-shielding layer LS.

It is desirable that the light-shielding layer LS has a thickness sufficient to shield light for the oxide semiconductor layer. In this example, the total thickness of the light-shielding layer LS is preferably 100 nm or more.

The light-shielding layer LS2 covers the top surface and side surface of the light-shielding layer LS1. In this case, the light-shielding layer LS may be provided in a stepped shape. As a result, it is possible to improve the coverage of the insulating layer (a gate insulating layer GI2, an insulating layer IL1 to be described later) with respect to the light-shielding layer LS.

In a plan view, the light-shielding layer LS overlaps the gate electrode GL1 and the oxide semiconductor layer OS. In this case, a width DLS of the light-shielding layer LS is larger than a width DOS1 of a width DGL1 and the oxide semiconductor layer OS1 of the gate electrode GL1. Thus, the light-shielding layer LS can suppress the light incident from the substrate SUB side from reaching the oxide semiconductor layer OS1.

[1-3. Configuration of Transistor Tr2]

The transistor Tr2 has a p-type transistor Tr2-1 and an n-type transistor Tr2-2. The transistor Tr2-1 and the transistor Tr2-2 are provided on the peripheral region located around the display region.

The p-type transistor Tr2-1 and the n-type transistor Tr2-2 both have a gate electrode GL2, a gate insulating layer GI2, and a semiconductor layer S. The gate electrode GL2 faces the semiconductor layer S. The gate insulating layer GI2 is provided between the semiconductor layer S and the gate electrode GL2. In the present embodiment, the bottom gate transistor in which the gate electrode GL2 is provided closer to the substrate SUB side than the semiconductor layer S is used for the p-type transistor Tr2-1 and the n-type transistor Tr2-2.

The semiconductor layer S of the p-type transistor Tr2-1 includes semiconductor layers S1 and S2. The semiconductor layer S of the n-type transistor Tr2-2 includes semiconductor layers S1, S2, and S3. The semiconductor layer S1 is a region that overlaps the gate electrode GL2 in a plan view. The semiconductor layer S1 functions as a channel of the transistor Tr2-1. The semiconductor layer S2 functions as a conductive layer. The semiconductor layer S3 functions as a conductive layer having higher resistance than the semiconductor layer S2. The semiconductor layer S3 suppresses hot carrier degradation by attenuating hot carriers intruding toward the semiconductor layer S1.

The insulating layer IL1 and the gate insulating layer GI1 are provided on the semiconductor layer S. In the transistor Tr2, the gate insulating layer GI1 simply functions as an interlayer film. A wiring W2 is provided on these insulating layers. The wiring W2 is connected to the semiconductor layer S via the opening provided in the insulating layer IL1 and the gate insulating layer GI1. The insulating layer IL2 is provided on the wiring W2. The wiring W1 is provided on the insulating layer IL2. The wiring W1 is connected to the wiring W2 via the opening provided in the insulating layer IL2.

In the present embodiment, the gate electrode GL2 and the light-shielding layer LS2 are provided in the same layer on the substrate. The wiring W2 and the gate electrode GL1 are provided in the same layer. "Provided in the same layer" means that members are formed simultaneously by patterning one layer. As described above, the light-shielding layer LS includes the light-shielding layer LS1 and the light-shielding layer LS2. Therefore, the total thickness TLS of the light-shielding layer LS is larger than the thickness TGL2 of the gate electrode GL2.

In the present embodiment, the semiconductor layer S in the p-type transistor Tr2-1 and the n-type transistor Tr2-2 is formed of silicone. The semiconductor layer S is polycrystallized by laser radiation. In the case where the gate electrode GL2 is provided thick, the heat at the time of laser irradiation is absorbed by the gate electrode GL2. Therefore, it is desirable that the thickness of the second gate electrode layer is controlled. Specifically, it is desirable that the thickness of the gate electrode GL2 is 50 nm or less. On the other hand, as described above, the entire thickness of the light-shielding layer LS in the transistor Tr1 preferably has a thickness of 100 nm or more. That is, the thickness of the light-shielding layer LS in the present embodiment is more than twice the thickness of the light-shielding layer LS2.

Here, in the conventional case, when the light-shielding property of the channel portion in the transistor Tr1 is low, characteristic fluctuation (e.g., threshold fluctuation) may occur in the reliability test (e.g., an NBTS (Negative Bias Temperature Stress test)).

However, in the present embodiment, the light-shielding layer LS provided on the lower side of the oxide semiconductor layer OS (particularly the oxide semiconductor layer OS1) is formed by two layers, and the gate electrode of the transistor in the peripheral circuit (the p-type transistor Tr2-1 and the n-type transistor Tr2-2) is formed by one layer of the two. As a result, while having a sufficient light-shielding property for the transistor T1, it is possible to stably perform polycrystallization of the silicon constituting the semiconductor layer S of the transistor Tr2 in the peripheral circuit. That is, it is possible to provide a display device capable of performing high-definition display while suppressing the characteristic fluctuation of the oxide semiconductor transistor.

[1-4. Configuration of Boundary Region Between a Display Region DR and Peripheral Region PR in Display Device]

FIG. 2 is a planar layout showing a part of the boundary region (edge of the display region) between the display region DR and a peripheral region PR. FIG. 3 is a cross-sectional schematic view between A1-A2 in FIG. 2. FIG. 4 is a cross-sectional schematic view between B1-B2 in FIG. 2. FIG. 5 is a schematic cross-sectional view between C1-C2 in FIG. 2.

In FIG. 2 to FIG. 4, the display region (pixel) DR is provided in the first direction D1. The peripheral region PR is provided towards the third direction D3. As shown in FIG. 2, in this example, the gate electrode GL1, the light-shielding layer LS1, and the light-shielding layer LS2 extend from the peripheral region PR and in the display region DR along the first direction D1. The gate electrode GL1 may be a "first gate wiring". In addition, the light-shielding layer LS1 and the gate electrode GL2 extend in the third direction D3 in the peripheral region PR. The gate electrode GL2 may be a "second gate wiring". A wiring connecting the first gate wiring and the second gate wiring corresponds to a gate wiring 331 to be described later.

As shown in FIG. 2 to FIG. 4, the light-shielding layer LS1 may be provided below the gate electrode GL2. The gate electrode GL2 and the light-shielding layer LS1 have conductivity. Thus, the thickness of the second-gate wiring is increased. Consequently, the resistance at the second gate wiring can be reduced. If the resistance of the gate electrode GL2 is low, the light-shielding layer LS1 may not be provided. The gate electrode GL2 which constitutes the second gate wiring is the gate electrode GL2 of the transistor Tr2. The light-shielding layer LS1 of the second gate wiring extends to the front of reaching the transistor Tr2.

An edge GL1a of the gate electrode GL1 of the display region DR is provided in the boundary region around the periphery of the display region DR. The edge GL1a protrudes in the second direction D2 intersecting the first direction (perpendicular in this example). The edge GL1a may be a "protrusion part". The edge GL1a of the gate electrode GL1 is connected to the light-shielding layer LS2 via a first opening GCON1 provided in the gate insulating layer GI1, the insulating layer IL1, and the gate insulating layer GI2 at the edge of the display region DR. In addition, the edge GL1a of the gate electrode GL1 is connected to the gate electrode GL2 via a second opening GCON2 (see FIG. 4).

In the present embodiment, a conductive layer is used for the light-shielding layer LS. In this case, the oxide semiconductor layer OS1 may be controlled by applying a voltage to the light-shielding layer LS. As described above, the edge GL1a of the gate electrode GL1 is connected to the light-shielding layer LS2. As a result, the gate electrode GL1 and the light-shielding layer LS2 have the same potential. Consequently, the transistor Tr including the oxide semiconductor layer OS1 is driven by the gate electrode GL1 and the light-shielding layer LS.

As shown in FIG. 2 to FIG. 4, the light-shielding layer LS2 of a display region DP and the gate electrode GL2 of a peripheral region PR are separated in the second direction D2 and connected to each other via the edge GL1a of the gate electrode GL1. More specifically, as described above, the light-shielding layer LS2 in the display region DR and the gate electrode GL2 in the peripheral region PR, which are formed in the same layer, are electrically connected to the gate electrode GL1 via the first opening GCON1 provided in the gate insulating layer GI1, the insulating layer IL1, and the gate insulating layer GI2 at the edge (boundary region) of the display region DR. The gate electrode GL1 is located between them.

The configuration of the conventional gate wiring is described. The conventional gate wiring is provided in a long, straight line over the display region DR (pixel circuit) and the peripheral region PR (peripheral circuit). If a peeling charge occurs in the process of lifting off the substrate from a manufacturing device when forming the gate wiring, the charge may be locally accumulated (specifically, at the edge of the gate wiring). When the display region (pixel circuit) and the peripheral region (peripheral circuit) are connected by the gate wiring as described above, the charge generated by the peeling charge moves along the wiring and accumulates at the edge of the gate wiring. This may lead to dielectric breakdown of transistors in peripheral circuits (specifically, the gate dielectric layer GI2). dielectric breakdown of the transistor provided in the peripheral circuit (specifically, the gate insulating layer GI2).

On the other hand, in the present embodiment, the gate electrode GL1 of the display region DR (the first gate wiring) and the gate electrode GL2 of the peripheral region (the second gate wiring) are formed in different processes, and these are separated from each other in the second direction D2 and are connected at the edge of the display region DR (boundary region). In addition, the gate electrode GL2 of the peripheral region PR and the light-shielding layer LS of the display region DR are provided separately from each other in the second direction D2 and are connected at the edge of the display region DR (boundary region) via the gate electrode GL1. Thus, even if the charges are locally accumulated due to the above peeling charge, such charge stays at the edges of these gate electrodes GL1 and light-shielding layer LS because the edge of the light-shielding layer LS and the gate electrode GL1 is arranged around the edge of the display region DR. So, this charge remains around the boundary of the display region DR. Therefore, it is possible to suppress the direct effect of the above charge on the transistor provided in the peripheral region PR. Therefore, the peripheral circuit (gate driver circuit in this example) can be operated stably.

As shown in FIG. 2 and FIG. 5, at least one dummy transistor DTr is provided at the edge of the display region DR for one gate electrode GL1. The dummy transistor DTr includes the light-shielding layer LS (the light-shielding layer LS1 and the light-shielding layer LS2), the gate insulating layer GI2, the insulating layer IL1, the oxide semiconductor layer OS (the oxide semiconductor layer OS1, the oxide semiconductor OS2), the insulating layer GI1, the gate electrode GL1, the insulating layer IL2, and the wiring W1. The oxide semiconductor layer OS may be formed of only the oxide semiconductor layer OS2.

The dummy transistor DTr is not connected to the transistor in the pixel circuit. The wiring W1 is provided to overlap the oxide semiconductor layer OS. More specifically, the wiring W1 has the same width as the oxide semiconductor layer in the first direction D1 and the second direction D2. The wiring W1 is connected to both ends of oxide semiconductor layer OS via the opening WCON provided in the insulating layer IL2 and the gate insulating layer GI1. By providing the dummy transistor DTr at the edge of the display region DR, unwanted charges existing in the display region DR can be absorbed. Therefore, the transistor in the pixel circuit can be protected.

[1-5. Material of Each Member of Display Device 10]

A rigid substrate having light transmittance and no flexibility, such as a glass substrate, a silica substrate, and a sapphire substrate, can be used as the substrate SUB. On the other hand, in the case where the substrate SUB needs to have flexibility, a flexible substrate containing a resin and having flexibility, such as a polyimide substrate, an acrylic substrate, a siloxane substrate, or a fluororesin substrate, can be used as the substrate SUB. In order to improve the heat resistance of the substrate SUB, impurities may be introduced into the above-described resins.

A general metal material can be used for the gate electrodes GL1, GL2, the wirings W1, W2, the light-shielding layer LS1, the light-shielding layer LS2, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and alloys or compounds thereof are used as these members. The above material may be used in a single layer or a stacked manner as the above members. In the present embodiment, the light-shielding layer LS1 may be a "first light-shielding metal layer". The light-shielding layer LS2 may be a "second light-shielding metal layer".

For example, a stacked structure of Ti/Al/Ti is used as the gate electrode GL1. In the present embodiment, the cross-sectional shape of a pattern edge of the gate electrode GL1 in the above stacked structure is a forward tapered shape.

A general insulating material can be used as the gate insulating layers GI1, GI2 and the insulating layers IL1 to IL5. For example, an inorganic insulating layer such as silicon oxide (SiOx), silicon oxide nitride (SiOxNy), silicon nitride (SiNx), silicon nitride oxide (SiNxOy), aluminum oxide (AlOx), aluminum oxide nitride (AlOxNy), aluminum nitride oxide (AlNxOy), aluminum nitride (AlNx) can be used as the insulating layers IL1 to IL3, IL5. A low defect insulating layer can be used as these insulating layers. An organic insulating material such as a polyimide resin, an acrylic resin, an epoxy resin, a silicon resin, a fluororesin, or a siloxane resin can be used as the insulating layer IL4. The above organic insulating material may be used as the gate insulating layers GI1, GI2 and the insulating layers IL1 to IL3, IL5. The above materials may be used in a single layer or a stacked manner as the above members.

A SiOx film with a thickness of 100 nm is used as the gate insulating layer GI1 as an example of the above insulating layer. A SiOx/SiNx/SiOx film with a total thickness of 600 nm to 700 nm is used as the insulating layer IL1. A SiOx/SiNx film with a total thickness of 60 nm to 100 nm is used as the gate insulating layer GI2. A SiOx/SiNx/SiOx film with a total thickness of 300 nm to 500 nm is used as the insulating layer IL2. A SiOx film (monolayer), A SiNx film (monolayer) with a total thickness of 200 nm to 500 nm or stacked films thereof are used as the insulating layer IL3. An organic layer with a thickness of 2 μm to 4 μm is used as the insulating layer IL4. A SiNx film (monolayer) with a thickness of 50 nm to 150 nm is used as the insulating layer IL5.

The above-described SiOxNy and AlOxNy are silicon compounds and aluminum compounds that contain a smaller proportion (x>y) of nitrogen (N) than oxygen (O). SiNxOy and AlNxOy are silicon compounds and aluminum compounds that contain a smaller proportion (x>y) of oxygen than nitrogen.

A metal oxide having semiconductor characteristics can be used as the oxide semiconductor layer OS. The oxide semiconductor layer OS has light transmittance. For example, an oxide semiconductor containing indium (In), gallium (Ga), zinc (Zn), and oxygen (O) can be used. In particular, an oxide semiconductor having a compositional ratio of In:Ga:Zn:O=1:1:1:4 can be used. However, the oxide semiconductor containing In, Ga, Zn, and O used in the present embodiment is not limited to the above composition, and an oxide semiconductor having a composition different from that described above can also be used. For example, in order to improve the mobility, the ratio of In may be made larger than that described above. The ratio of Ga may be made larger to increase the band gap and reduce the influence of light irradiation.

Other elements may be added to the oxide semiconductor containing In, Ga, Zn, and O. For example, a metal element such as Al or Sn may be added to the oxide semiconductor. Besides the oxide semiconductor described above, an oxide semiconductor containing In and Ga (IGO), an oxide semiconductor containing In and Zn (IZO), an oxide semiconductor containing In, Sn, and Zn (ITZO), and an oxide semiconductor containing In and W may be used as the oxide semiconductor layer OS. The oxide semiconductor layer OS may be amorphous or crystalline. The oxide semiconductor layer OS may be a mixed phase of amorphous and crystalline.

A transparent conductive layer is used as the connecting electrode ZTCO, the pixel electrode PTCO, and the common electrode CTCO. A mixture of indium oxide and tin oxide (ITO), and a mixture of indium oxide and zinc oxide (IZO) can be used as the transparent conductive layer. Materials other than the above may be used as transparent conductive layer.

According to the present embodiment, conduction between the oxide semiconductor layer OS and connecting electrode ZTCO can be ensured by directly connecting the oxide semiconductor layer OS and connecting electrode ZTCO of the transistor T1. Therefore, there is no need to provide a metal layer between the oxide semiconductor layer OS and the connecting electrode ZTCO. Therefore, since the opening ZCON (the first contact region CON1) is not shielded from light, it is possible to suppress a decrease in the opening ratio.

Since the oxide semiconductor layer has light transmittance, in the present embodiment, although the semiconductor layer is exposed in the opening region in the pixel region, the light from the backlight passes through the oxide semiconductor layer. Therefore, the decrease in the transmittance of the opening region due to the exposure of the oxide semiconductor layer to the opening region is reduced as much as possible. Since the layer exposed to the display region is the oxide semiconductor layer OS which has light transmittance and in which unevenness of transmitted light hardly occurs such as in a silicon layer, it is possible to suppress the occurrence of display unevenness.

Second Embodiment

The entire configuration of the display device described in the first embodiment will be described with reference to FIG. 6 to FIG. 8.

[Outline of Display Device 20]

Figure 6:
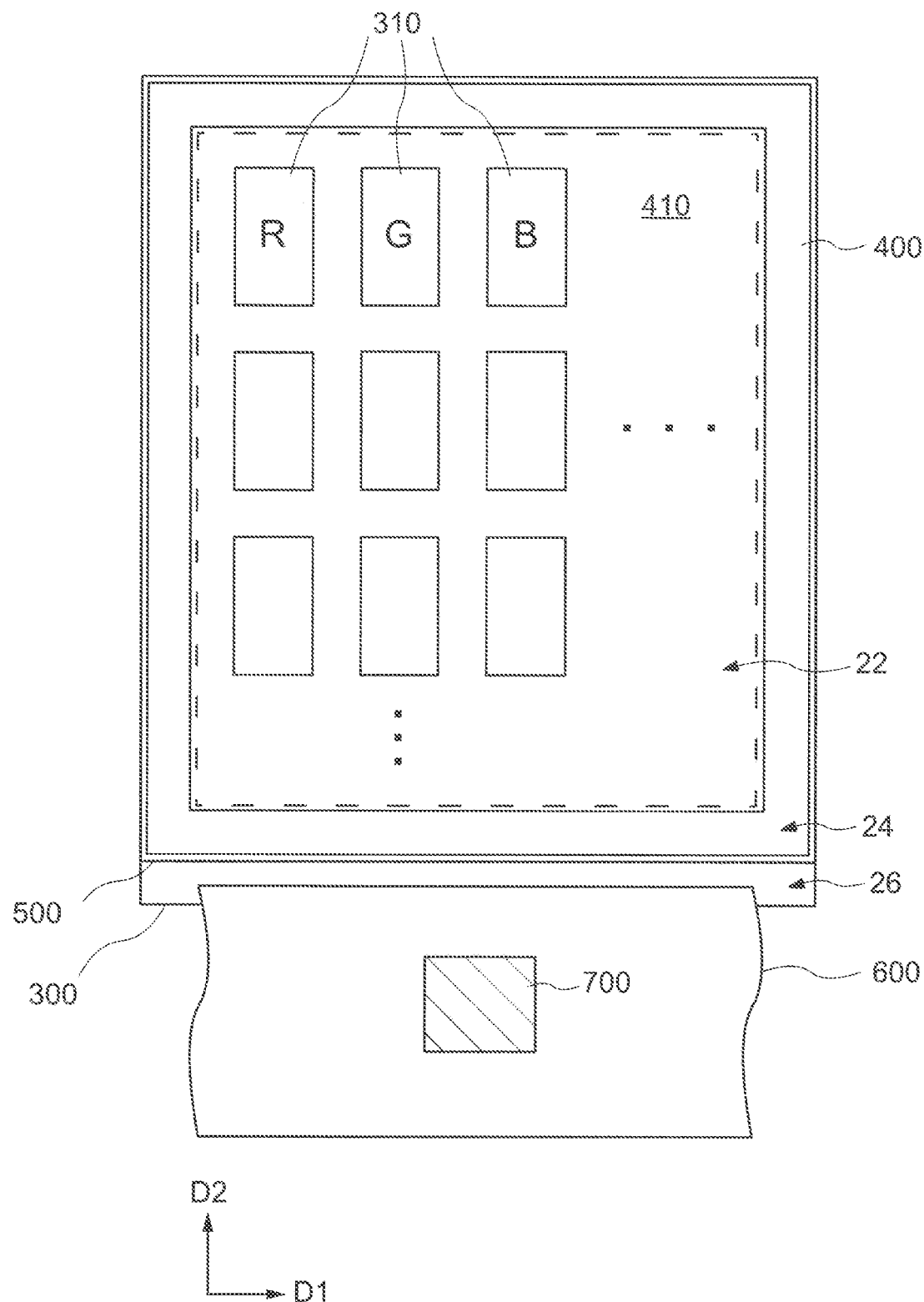
FIG. 6 is a plan view showing an outline of a display device according to an embodiment of the present invention.

FIG. 6 is a plan view showing an outline of a display device according to an embodiment of the present invention. As shown in FIG. 6, a display device 20 includes an array substrate 300, a sealing portion 400, an opposing substrate 500, a flexible printed circuit board 600 (FPC 600), and an IC chip 700. The array substrate 300 and the opposing substrate 500 are bonded by the sealing portion 400. A plurality of pixel circuits 310 is arranged in a matrix in a liquid crystal region 22 surrounded by the sealing portion 400. The liquid crystal region 22 is a region that overlaps a liquid crystal element 410 to be described later in a plan view.

A sealing region 24 in which the sealing portion 400 is provided is a region around the liquid crystal region 22. The FPC 600 is provided in a terminal region 26. The terminal region 26 is a region where the array substrate 300 is exposed from the opposing substrate 500, and the terminal region 26 is provided on the outside of the sealing region 24. The outside of the sealing region 24 means the outside of the region provided with the sealing portion 400 and surrounded by the sealing portion 400. The IC chip 700 is provided on the FPC 600. The IC chip 700 supplies a signal for driving each pixel circuit 310.

[Circuit Configuration of Display Device 20]

Figure 7:
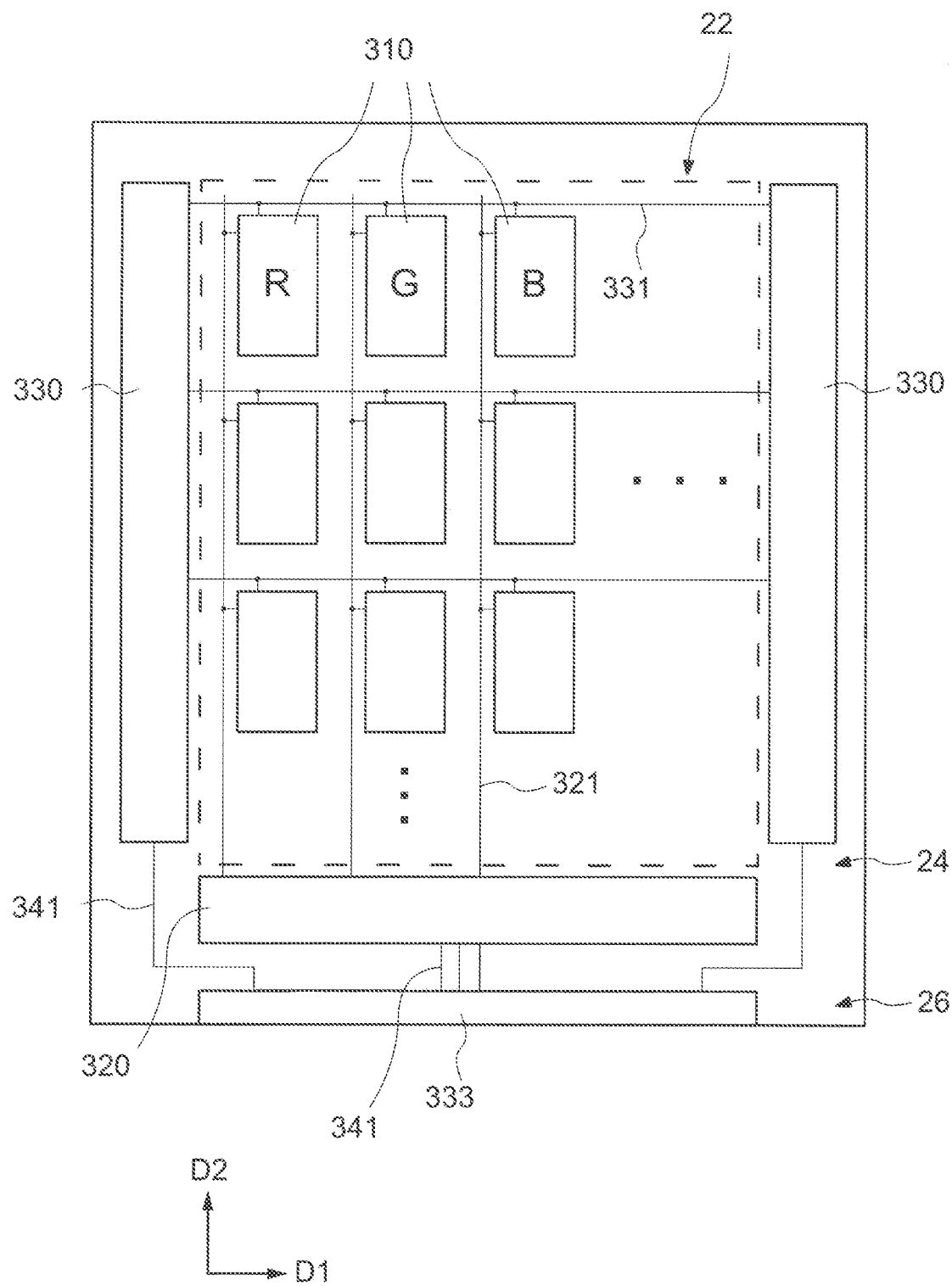
FIG. 7 is a block diagram showing a circuit configuration of a display device according to an embodiment of the present invention.

FIG. 7 is a block diagram showing a circuit configuration of a display device according to an embodiment of the present invention. As shown in FIG. 7, a source driver circuit 320 is provided at a position adjacent to the second direction D2 (column direction) with respect to the liquid crystal region 22 where the pixel circuit 310 is arranged, and a gate driver circuit 330 is provided at a position adjacent to the first direction D1 (row direction) with respect to the liquid crystal region 22. The source driver circuit 320 and the gate driver circuit 330 are provided in the sealing region 24 described above. However, the region where the source driver circuit 320 and the gate driver circuit 330 are provided is not limited to the sealing region 24 and may be any region as long as it is outside the region where the pixel circuit 310 is provided. The source driver circuit 320 and the gate driver circuit 330 may be used as peripheral circuits. Furthermore, the liquid crystal region 22 and the sealing region 24, and the display region DR and the peripheral region PR in the first embodiment may or may not coincide with each other. Specifically, a configuration in which a part or all of the peripheral region PR is included in the liquid crystal region 22 can also be employed, and although there is a region where there is no pixel electrode PTCO around the edge of the display region DR shown in FIG. 2, the region can also be the liquid crystal region 22.

A source wiring 321 extends from the source driver circuit 320 in the second direction D2. The source wiring 321 is connected to the plurality of pixel circuits 310 arranged in the second direction D2. The gate wiring 331 extends from the gate driver circuit 330 in the first direction D1. The gate wiring 331 is connected to the plurality of pixel circuits 310 arranged in the first direction D1.

The terminal region 26 is provided with a terminal unit 333. The terminal unit 333 and the source driver circuit 320 are connected by a connection wiring 341. Similarly, the terminal unit 333 and the gate driver circuit 330 are connected by the connection wiring 341. By connecting the FPC 600 to the terminal unit 333, an external device to which the FPC 600 is connected and the display device 20 are connected, and each pixel circuit 310 provided in the display device 20 is driven by a signal from the external device.

The transistor Tr shown in the first embodiment and the second embodiment is used in the pixel circuit 310. The transistor Tr2 shown in the first embodiment and the second embodiment is applied to the transistor included in the source driver circuit 320 and the gate driver circuit 330.

[Pixel Circuit 310 of Display Device 20]

Figure 8:
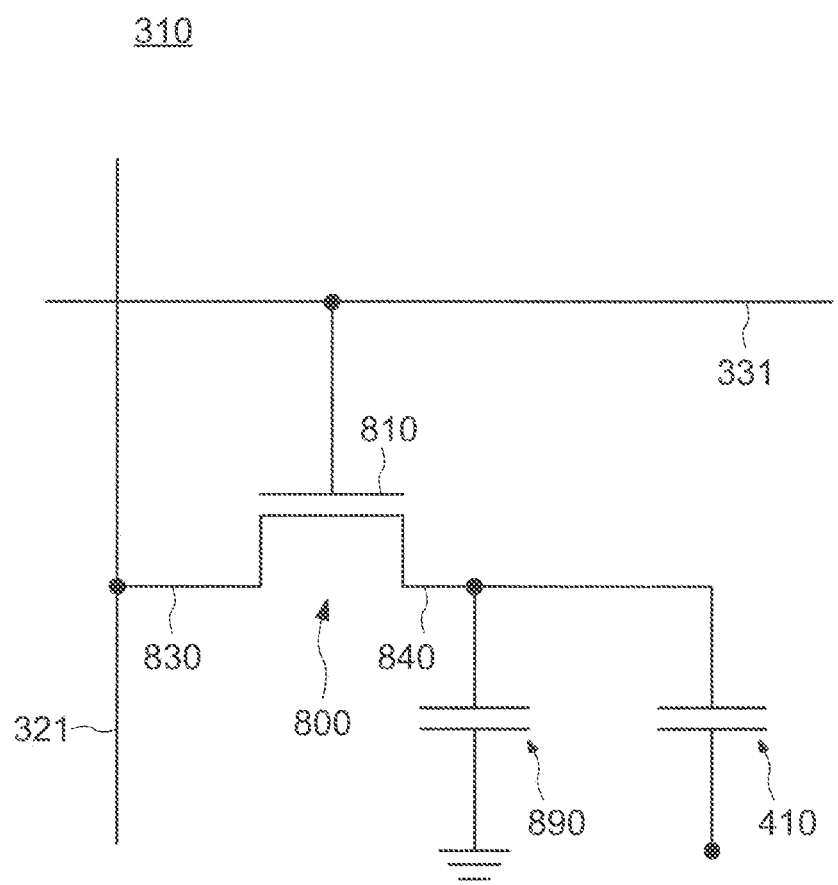
FIG. 8 is a circuit diagram showing a pixel circuit of a display device according to an embodiment of the present invention.

FIG. 8 is a circuit diagram showing a pixel circuit of a display device according to an embodiment of the present invention. As shown in FIG. 8, the pixel circuit 310 includes elements such as a transistor 800, a holding capacity 890, and the liquid crystal element 410. One electrode of the holding capacity 890 is the pixel electrode PTCO and the other electrode is the common electrode CTCO. Similarly, one electrode of the liquid crystal element 410 is the pixel electrode PTCO and the other electrode is the common electrode CTCO. The transistor 800 includes a first gate electrode 810, a first source electrode 830, and a first drain electrode 840. The first gate electrode 810 is connected to the gate wiring 331. The first source electrode 830 is connected to the source wiring 321. The first drain electrode 840 is connected to the holding capacity 890 and the liquid crystal element 410. The transistor Tr shown in the first embodiment and the second embodiment is applied to the transistor 800 shown in FIG. 8. In the present embodiment, for convenience of explanation, although 830 is referred to as the source electrode and 840 is referred to as the drain electrode, the function as the source and the drain of each electrode may be replaced.

(Modifications)

Each of the embodiments described above as an embodiment of the present invention can be appropriately combined and implemented as long as they do not contradict each other. The addition, deletion, or design change of components, or the addition, deletion, or condition change of process as appropriate by those skilled in the art based on each embodiment are also included in the scope of the present invention as long as they are provided with the gist of the present invention.

Other working effects which are different from the working effect brought about by the mode of each embodiment described above are naturally understood to be brought about by the present invention from what is clear from the description in this specification or what can be easily predicted by the person skilled in the art.

In addition, although an example in which a metal material is used for the light-shielding layer LS1 has been described in the first embodiment of the present invention, the present invention is not limited thereto. For example, a resin material having a light-shielding property may be used for the light-shielding layer LS1. Specifically, the light-shielding layer LS1 may be formed of a black resin.

What is claimed is:
1. A display device comprising:
a substrate;
a first transistor including an oxide semiconductor layer, a first gate insulating layer, and a first gate electrode, the first transistor being provided in a display region;
a light-shielding layer provided between the substrate and the oxide semiconductor layer; and a second transistor including a second semiconductor layer, a second gate insulating layer, and a second gate electrode, the second transistor being provided in a peripheral region located around the display region, and the second semiconductor layer containing silicon, wherein the light-shielding layer includes a first light-shielding metal layer and a second light-shielding metal layer, the first light-shielding metal layer is provided between the substrate and the oxide semiconductor layer, the second light-shielding metal layer covers the top surface and side surface of the first light-shielding metal layer and faces the oxide semiconductor layer, and the second light-shielding metal layer and the second gate electrode are provided on a same layer.

2. The display system according to claim 1, wherein
the first gate electrode extends from the display region to the peripheral region, and
the second gate electrode is connected to the first gate electrode at an edge of the display region.

3. The display system according to claim 1, wherein
the thickness of the light-shielding layer is 100 nm or more.

4. The display system according to claim 1, wherein
a width of the light-shielding layer is greater than a width of the first gate electrode.

5. The display system according to claim 1, wherein
the first gate electrode and the light-shielding layer are electrically connected.

6. The display system according to claim 1, wherein the first gate electrode extends in a first direction from the display region to the peripheral region, and includes a protruding portion protruding in a second direction intersecting the first direction at the periphery of the display region, a main line portion of the first gate electrode and the second gate electrode are separated from each other in the direction intersecting the extending direction, and the main line portion of the first gate electrode and the second gate electrode are connected to each other via the protruding portion of the first gate electrode.

7. The display system according to claim 1, wherein
the first gate electrode extends in a first direction from the display region to the peripheral region,
at least one dummy transistor is provided between the oxide semiconductor layer and an edge of the first gate electrode, and the at least one dummy transistor is provided with an oxide semiconductor layer and a wiring overlapping the oxide semiconductor layer, and
the oxide semiconductor layer and the wiring intersect with the first gate electrode and are connected to each other at both edges of the oxide semiconductor layer and the wiring.

8. The display system according to claim 1, wherein
the oxide semiconductor layer of the dummy transistor is formed in the same layer as the oxide semiconductor layer of the first transistor, and
the wiring is formed in an upper layer than the first gate electrode.

9. A display device comprising;
a substrate;
a first transistor including an oxide semiconductor layer, a first gate insulating layer, and a first gate electrode, the first transistor being provided in a display region;
a light-shielding layer provided between the substrate and the oxide semiconductor layer and overlapping the oxide semiconductor layer, and
a second transistor including a second semiconductor layer, a second gate insulating layer, and a second gate electrode, the second transistor being provided in a peripheral region located around the display region, and the second semiconductor layer containing silicon, wherein a thickness of the light-shielding layer is greater than a thickness of the second gate electrode, the first gate electrode extends in a first direction from the display region to the peripheral region, and the second gate electrode is connected to the first gate electrode at an edge of the display region.

10. The display device according to claim 9, wherein
the thickness of the light-shielding layer is twice or greater than the thickness of the second gate electrode.

11. The display system according to claim 9, wherein
the light-shielding layer includes a first light-shielding metal layer and a second light-shielding metal layer that covers a top surface and a side surface of the first light-shielding metal layer.

12. The display system according to claim 9, wherein
the thickness of the light-shielding layer is 100 nm or more.

13. The display system according to claim 9, wherein
a width of the light-shielding layer is greater than a width of the first gate electrode.

14. The display system according to claim 9, wherein
the first gate electrode and the light-shielding layer are electrically connected.

15. The display system according to claim 9, wherein
the first gate electrode includes a protruding portion protruding in a second direction intersecting the first direction at the periphery of the display region,
a main line portion of the first gate electrode and the second gate electrode are separated from each other in the direction intersecting the extending direction, and
the main line portion of the first gate electrode and the second gate electrode are connected to each other via the protruding portion of the first gate electrode.

16. The display system according to claim 9, wherein
at least one dummy transistor is provided between the oxide semiconductor layer and an edge of the first gate electrode, and the at least one dummy transistor is provided with an oxide semiconductor layer and a wiring overlapping the oxide semiconductor layer, and
the oxide semiconductor layer and the wiring intersect with the first gate electrode and are connected to each other at both edges of the oxide semiconductor layer and the wiring.

17. The display system according to claim 16, wherein
the oxide semiconductor layer of the dummy transistor is formed in the same layer as the oxide semiconductor layer of the first transistor, and
the wiring is formed in an upper layer than the first gate electrode.

18. A display device comprising;
a substrate;
a first transistor including an oxide semiconductor layer, a first gate insulating layer, and a first gate electrode, the first transistor being provided in a display region;
a light-shielding layer provided between the substrate and the oxide semiconductor layer and overlapping the oxide semiconductor layer, and
a second transistor including a second semiconductor layer, a second gate insulating layer, and a second gate electrode, the second transistor being provided in a peripheral region located around the display region, and the second semiconductor layer containing silicon, wherein a thickness of the light-shielding layer is greater than a thickness of the second gate electrode, the first gate electrode extends in a first direction from the display region to the peripheral region, at least one dummy transistor is provided between the oxide semiconductor layer and an edge of the first gate electrode, and the at least one dummy transistor is provided with an oxide semiconductor layer and a wiring overlapping the oxide semiconductor layer, and the oxide semiconductor layer and the wiring intersect with the first gate electrode and are connected to each other at both edges of the oxide semiconductor layer and the wiring.

19. The display system according to claim 18, wherein the oxide semiconductor layer of the dummy transistor is formed in the same layer as the oxide semiconductor layer of the first transistor, and the wiring is formed in an upper layer than the first gate electrode.

* * * * *